United States Patent [19]

Bratt

[11] 4,072,528
[45] Feb. 7, 1978

[54] OXYGEN BARRIER LAYERS FOR PHOTOPOLYMERIZABLE ELEMENTS

[75] Inventor: Martin Daniel Bratt, Old Bridge, N.J.

[73] Assignee: E. I. Du Pont de Nemours and Company, Wilmington, Del.

[21] Appl. No.: 692,599

[22] Filed: June 3, 1976

Related U.S. Application Data

[63] Continuation-in-part of Ser. No. 292,503, Sept. 27, 1972, abandoned.

[30] Foreign Application Priority Data

Sept. 22, 1973 Germany .............................. 2347784
Sept. 26, 1973 Belgium ................................. 136064
Sept. 27, 1973 Japan ................................. 48-108053

[51] Int. Cl.$^2$ .............................................. G03C 1/78
[52] U.S. Cl. ................................... 96/87 R; 96/35.1; 96/67; 96/86 P; 96/50 PL
[58] Field of Search ............... 96/115 R, 115 P, 35.1, 96/87 R, 67, 86, 50 PL

[56] References Cited

U.S. PATENT DOCUMENTS

| 2,731,347 | 1/1956 | Gray | 96/114 |
| 3,240,604 | 3/1966 | Cook | 96/87 R |
| 3,443,946 | 5/1969 | Grabhofer et al. | 96/67 |
| 3,458,311 | 7/1969 | Alles | 96/35.1 |
| 3,539,344 | 11/1970 | Russell | 96/67 |

*Primary Examiner*—Edward C. Kimlin

[57] ABSTRACT

Photopolymerizable elements are provided which comprise: (1) A support, (2) an addition polymerizable photosensitive layer, and (3) a solid, water-permeable, oxygen barrier protective layer, nonstrippable as an unsupported film, said layer covering the entire photosensitive layer and being coated from an aqueous solution of a water-soluble macromolecular organic polymer or copolymer, e.g., polyvinyl alcohol, having dispersed therein, finely divided solid particles of a water-insoluble chlorinated vinyl polymer or copolymer.

6 Claims, No Drawings

OXYGEN BARRIER LAYERS FOR PHOTOPOLYMERIZABLE ELEMENTS

CROSS REFERENCE TO RELATED APPLICATION

This is a continuation-in-part of application Ser. No. 292,503, filed Sept. 27, 1972, now abandoned.

BACKGROUND OF THE INVENTION

1. Field of the Invention

This invention relates to photopolymerizable elements useful in the photomechanical arts, e.g., lithographic printing plates and printed circuits.

2. Description of the Prior Art

Alles, U.S. Pat. No. 3,458,311, July 29, 1969, discloses a homogeneous solid protective layer transparent to actinic radiation on a photopolymerizable stratum coated on a support. The protective stratum is nonstrippable as an unsupported film, substantially impermeable to oxygen, water-permeable and composed of a macromolecular polymer or polymer mixtures soluble in water or water mixed with a water-miscible organic solvent. The layer imparts enhanced speed and contrast to photopolymerizable strata because of oxygen impermeability. The layer also is more easily applied and removable during the development washout of the exposed photopolymerizable stratum than the unitary cover sheets of the prior art. However, the protective layers of the Alles patent, when using the macromolecular polymers alone or in admixture, tend either to have poor adhesion for the photopolymerizable layer or under conditions of high humidity, become tacky and tend to be damaged by material in contact with its outer surface. The previously proposed protective layers tend to adhere to image films i.e., photographic negatives, "goldenrod" paper and opaquing material conventionally used on the negatives when such materials are placed in contact with said layers during exposure in vacuum printing frames, particularly under conditions of high humidity. The adhesion usually causes the protective layer to pull away from the photopolymerizable layer when the image film is removed after exposure. Detachment of the protective layer before and during exposure is detrimental to the quality of the photopolymer layer, especially in the conventional step-and-repeat exposure machines used in making lithographic printing plates. The damage caused by the detachment of the protective layer manifests itself by lowering the photographic speed and causing poor image quality because of reciprocity failure under conditions of low intensity exposure and insufficient vacuum in the printing frame. The resulting printing plates exhibit poor wear qualities and also poor exposure and processing latitude.

Several U.S. patents are known wherein photosensitive materials have layers which contain solid particles. The solid particles are not present in a layer for the purpose of improving adhesion between the particle-containing layer and another layer of the photosensitive materials.

Russell, U.S. Pat. No. 3,539,344 relates to coatings of protective material which contain beads of synthetic resins, the coatings being present in the photosensitive material only at surface areas that are not intended for photographic recording. The polymer beads of Russell are for the purpose of providing mechanical separation between stacked film.

Grabhofer et al. U.S. Pat. No. 3,773,976 relates to a transparent roughened protective layer on a silver halide emulsion. The protective layer contains acrylonitrile particles to roughen the surface of a layer to enable it to be written on. There is no teaching that the protective layer presents oxygen inhibition since the photosensitive layer is a silver halide emulsion layer and not a photopolymerizable layer.

Cook, U.S. Pat. No. 3,240,604 teaches adding polytetrafluoroethylene particles to a layer on a silver halide element to prevent blocking or adhering when the elements are stacked or packaged together. There is no teaching or need to preclude oxygen from inhibiting the light sensitive layer. The layer is designed to be water resistant, not water permeable.

Gray, U.S. Pat. No. 2,731,347 teaches the use of polytetrachloroethylene type polymers for delustering silver halide emulsion layers. It does not disclose acrylic or alkacrylic polymers in an oxygen impermeable protective stratum.

SUMMARY OF THE INVENTION

It has now been found that the difficulties encountered by the prior art protective layers can be overcome by this invention. The novel photopolymerizable elements of this invention comprise, in order, (1) a support which may embody antihalation material in or on its surface, (2) a solid photopolymerizable stratum containing (a) at least one nongaseous ethylenically unsaturated monomeric compound containing at least one terminal ethylenic group, and being capable of forming an insoluble polymer by photoinitiated addition polymerization, (b) an addition polymerization initiating system activatable by actinic radiation, and (c) an organic macromolecular polymer binder for and compatible with said unsaturated monomeric compound, and (3) an adherent, solid, protective stratum over the entire area of said photopolymerizable stratum transparent to actinic radiation, said protective stratum having a thickness of 0.2 to 25 microns and being characterized in that it is (i) nonstrippable as an unsupported film, (ii) substantially impermeable to oxygen, and (iii) water-permeable and composed of a macromolecular organic polymer or polymer mixture that is soluble in water or in a mixture of water and a water-miscible organic solvent, and said protective stratum having dispersed therein, solid particles of at least one water-insoluble chlorinated vinyl polymer, and homopolymers and copolymers (including terpolymers) of chlorinated vinyl polymers and mixtures thereof, said particles being at least 0.05 microns in diameter and being present in amounts from 10 to 60 percent by weight of the total polymer in said protective stratum.

DETAILED DESCRIPTION OF THE INVENTION

Monomeric constituent (a) and polymeric binder constituent (c) are preferably present in the photopolymerizable layer in amounts from 10 to 60 parts and 90 to 40 parts, by weight, respectively, and constituent (b) should be present in an amount of 0.5 to 10 parts by weight of constituent (a) the ethylenically unsaturated compound.

Useful macromolecular, water-soluble organic polymers having the characteristics given above include polyvinyl alcohol and its partial esters, ethers and acetals, or copolymers thereof that contain a substantial amount of unsubstituted vinyl alcohol units, so that they have the requisite solubility in water. Suitable such polymers include 88% to 100% hydrolyzed polyvinyl acetate, chloroacetate or propionate, polyvinyl formal and polyvinyl acetal and copolymers thereof. Other useful polymers include gelatin and gum arabic.

Useful water-insoluble polymers can be selected from a large group of known chlorinated vinyl polymers, copolymers and terpolymers including vinylidene chloride homopolymers, vinylidene chloride-acrylonitrile copolymer, and vinylidene chloride with alkyl (1–4 carbons) acrylate and an unsaturated carboxylic acid, as shown for example in Assignee's Alles et al., U.S. Pat. No. 2,627,088, and Swindells, U.S. Pat. No. 2,698,235. In addition, mixtures of the above terpolymers and homopolymers and/or copolymers may be used such as those disclosed in Assignees Rawlins U.S. Pat. No. 3,567,452 and Cohen, U.S. Pat. No. 3,460,944. Further useful, polymer combinations can be derived from the sequential polymerization of a mixture of (a) vinylidene chloride/alkyl acrylate/itaconic acid copolymer wherein the alkyl group contains 1–4 carbon atoms and said components are present in the respective amounts by weight 35 to 96%, 3.5 to 64.5% and 0.5 to 25% and (b) a polymer, i.e., homopolymer or copolymer, of an acrylate ester selected from the group consisting of (i) alkyl acrylates wherein the alkyl group contains 1–10 carbon atoms and (ii) alkyl methacrylates wherein the alkyl group contains 1–10 carbon atoms, polymerized in an aqueous dispersion of terpolymer (a), the terpolymer (a) and polymer (b) in the respective amounts by weight of 90 to 60% and 10 to 40%. The method of carrying out the sequential polymerization of the above components is described in Assignee's, Rawlins, U.S. Pat. No. 3,443,950.

The above described polymers and mixtures thereof may be added as hydrosols to aqueous solutions of the macromolecular polymers described under (3) above in amounts from 10% to 60% based on the total polymer in the composition which may be coated on any photosensitive surface to accomplish the objectives stated above. The particle size of the dispersed polymer may range from 0.05 to 5.0 microns or more in diameter. The aqueous dispersions may and preferably do contain a small amount of a finely divided, inorganic filler, e.g., colloidal silica.

The aqueous dispersions are coated and dried in a conventional manner, infra-red lamps being a convenient source of heat for drying.

Suitable photopolymerizable layers and supports include those disclosed in Alles, U.S. Pat. Nos. 3,458,311, Heiart, 3,060,026, and Chang and Fan 3,549,367. Preferred supports are thin and flexible, and have a hydrophilic surface, e.g., grained aluminum sheets, steel plates and copper clad epoxy-fiber glass boards. The photopolymerizable layers may contain dyes, pigments, fillers, thermal polymerization inhibitors, plasticizers, and other ingredients, including the specific ingredients of these types that are described in Burg, U.S. Pat. No. 3,203,805 and the Alles, and Heiart patents listed above, and chain transfer agents as described in Barney et al., U.S. Pat. No. 3,046,127.

Useful specific polymer binders for the monomerinitiating system in the photopolymerizable layer include those listed in the four just-mentioned patents and those described later in this application which contain acid or water-soluble salt groups, e.g., carboxyl and sulfonic groups, e.g., carboxyl and sulfonic groups and their sodium, potassium, ammonium, substituted ammonium or amine salts. There must be insufficient acid groups to make the polymer soluble in a dilute sodium hydroxide solution alone, but it should be soluble in a mixture of an organic solvent, water, and sufficient alkali to convert the majority of the acid groups to water soluble salt groups. A combination of certain especially preferred binder materials and an ethylenically unsaturated compound that is preferably water insoluble for the formation of lithographic printing plates are those disclosed in the above mentioned Alles patent.

Systems comprising photopolymerizable layers which are coated on copper-clad, epoxy fiber flass boards, the polymeric binders of which are only soluble in organic solvents and do not contain the above-described solubilizing groups may also utilize the protective strata of this invention. In addition, the transfer process described in the above Heiart patent may also use the protective strata of this invention in place of the unitary, strippable, cover sheet of that patent. The elements used in the process described in Celeste, U.S. Pat. No. 3,469,982 may also utilize the novel protective layers of this invention. After exposure, the protective stratum is removed by immersion in water or in a mixture of water and a water miscible organic solvent containing at least 50% by volume of water.

The protective stratum is applied from an aqueous dispersion of the water-soluble macromolecular organic polymer and dispersed, water insoluble polymers and copolymers. The resulting layer, after it is dried, has adequate adhesion to the photopolymerizable layer and is so thin that it cannot be stripped mechanically, unsupported, as a unitary layer from the surface of the photopolymerizable layer. If a surfactant having wetting properties is present in the coating composition, a more uniform layer results. The layer is very thin, being from 0.2 to 25.0 microns in thickness, and preferably is removable in the conventional developer solutions used to form a printing relief after imagewise exposure of the photopolymerizable layer. The latter layer is removable imagewise whereas the protective layer is removable over the entire area of the element treated. Because the useful water-insoluble chlorinated vinyl polymers are negatively charged, an anionic or nonionic surfactant should be used in the system. Cationic surfactants should ordinarily be avoided, because they tend to cause the polymers to flocculate or coagulate. Useful surfactants include sodium alkyl sulfates and sulfonates of 12–18 carbon atoms, e.g., sodium dodecylsulfate and sodium octadecylsulfonate; polyethylene glycols of average molecular weight below 400 and derivatives, e.g., iso-octylphenyl polyethoxyethanol (9–10 ethoxy groups, etc.).

In the preparation of printing plates as described in the above Alles patent where the protective layers of this invention are especially useful, the developer solution can be used as a bath or in the form of a spray. Removal of the unexposed areas of the photopolymerizable layer can be improved by brushing, by the application of a wet sponge and rubbing, and by other known procedures. Such treatments aid in the removal of the protective layers from the relief images.

The solvent media used to develop the exposed plates are aqueous media, i.e., water is the major constituent.

The developers also contain a water-miscible organic solvent and an alkaline material. Suitable organic solvents include isopropanol, butanol, diacetone alcohol, 1-methoxyethanol, 2-ethoxyethanol, 2-n-butoxyethanol, ethyl carbitol and butyl carbitol. Suitable alkaline materials include metal hydroxides, sodium metasilicate, triethanolamine, morpholine, trisodium phosphate, sodium carbonate, sodium borate, etc. The developer may also contain a surface active wetting agent. Other ingredients of the developer include dyes, salts to control swelling, salts to etch the metal base, etc. Other suitable developing solutions are those disclosed in Alles, U.S. Pat. Nos. 3,475,171 and Lam, 3,615,480 and 3,627,685.

The support, in the case of preparing lithographic plates according to the above mentioned Alles patent, preferably has a hydrophilic surface at the time the photopolymerizable layer is applied. Thus, when the plate is exposed and developed to remove the photopolymerizable layer in the unexposed areas, the areas of the support which are uncovered will be desensitized, i.e., they will repel a greasy or lipophilic ink while being receptive to water and aqueous solutions.

Preferably, the support is thin and flexible, ranging from about 0.005 to 0.03 inch in thickness. Aluminum is commercially available in a wide variety of thicknesses. The aluminum may be untreated (except for a thin layer of oxide which forms immediately at its surface when exposed to air) or may have been provided with surface treatments or coatings to leave a hydrophilic surface e.g. anodized aluminum for lithographic printing plates. The surface can be, and preferably is roughened (mechanically, chemically, or electrochemically) to improve retention of aqueous liquids and to improve adhesion to strata to be applied thereon. Other metals suitable for supports include bi-metal supports such copper clad aluminum, tin-plated steel, aluminum clad steel, nonplated steel, galvanized carbon steel, and zinc; plastic films, e.g., the polyethylene terephthalate films and copolymer coated films disclosed in Alles, U.S. Pat. No. 2,779,684, and paper and cardboard treated in a manner to impart a hydrophilic surface. Also other surfaces which are not hydrophilic may be used such as copper clad epoxy fiber glass boards for the preparation of printed circuits and other photomechanical uses.

Results similar to those obtained below can also be obtained by substituting for the photopolymerizable compositions of the following Examples, other specific organic polymers containing acid groups, including the copolymers disclosed in Example IX of Alles, U.S. Pat. No. 3,458,311 and the addition copolymers described in Barney, U.S. Pat. No. 2,893,868, patented July 7, 1959. The polymers of this latter patent contain, for example, lateral free acid groups, such as sulfonic, carboxylic and phosphoric acid groups. When these polymers, before esterification, can be neutralized with a base, for example, with an alkali metal hydroxide, e.g., sodium or potassium hydroxide, or a corresponding carbonate or ammonia or substituted ammonium base, e.g., tetramethylammonium hydroxide and tetraethylammonium hydroxide or an organic amine, e.g., ethanolamine, ethylenediamine, diethylenetriamine, 2-amino-2-hydroxy-2-methyl-1,3-propandiol-1,3-diaminopropanol-2 and morpholine, the free acid groups are converted to salt groups and the resulting layers have the advantage that they can be removed in aqueous solvents free from alkali.

Preferred photopolymerizable monomers that can be present in the photosensitive layer include substantially water-insoluble materials containing two or more terminal ethylenic groups which are disclosed in Plambeck, U.S. Pat. No. 2,760,863 and Burg et al., U.S. Pat. No. 3,060,023. Monomers with only a single terminal ethylenic group can be employed, but the composition will be considerably less sensitive to actinic radiation. When chain transfer agents are present in the photopolymerizable layer, especially polyolefin oxides, as listed in U.S. Pat. No. 3,046,127, glycerol, triethylene glycol diacetate, and triethylene glycol dicaprate and dicaprylate mixed ester, higher speeds are obtained. The chain transfer agent, if present, can be used in amounts up to 50% based on the amount of ethylenically unsaturated monomer.

Useful addition polymerization initiators activatable by actinic radiation and thermally inactive below 85° C consist of substituted and unsubstituted polynuclear quinones. Specific useful quinones of this type that can be used in the photosensitive layers of this invention are listed in Notley, U.S. Pat. No. 2,951,758 patented Sept. 6, 1960. Other lophine dimers (bis-2,4,5-triphenyl imidazoles) in addition to those disclosed in Example I, X and XI of Notley can also be used such as those disclosed in British Pat. No. 997,396 published July 7, 1965 and 1,047,569 published Nov. 9, 1966. Suitable free radical producing hydrogen doner agents for use in such systems, e.g., organic amines, mercaptans, triphenylmethane dyes are set forth in the above British Specifications. Suitable color amine-substituted leuco dyes which function both as a colorforming agent and a free radical generating agent can be used in the photosensitive layers of this invention. Especially useful leuco dyes have at least one dialkylamino group. Also any amine substituted leuco triphenylmethane dye or various salts of the dye can be used. Leuco forms of crystal violet which are oxidized upon exposure to form visible images are preferred. Other suitable leuco dyes or their salts are disclosed in Chang and Fan, U.S. Pat. No. 3,549,367 patented Dec. 22, 1970. Thermal addition polymerization inhibitors, as described in this patent, can be present in the photopolymerizable layers in amounts set forth in the patent.

Printing plates made from the elements of this invention have unusually long press life. The thin protective coatings containing dispersed finely divided solid particles of at least one water-insoluble chlorinated vinyl polymer or copolymer (including terpolymer) have many advantages over the thin protective layers and strippable protective films of the prior art. They are extremely insensitive to humidity and temperature changes resulting in layers having good adhesion to the underlying photosensitive layer and low surface tackiness which eliminates damage by "goldenrod" masking papers and opaqued negatives placed in surface contact with the elements, particularly during exposure in vacuum printing frames. The layers are equally as oxygen impermeable layers as those disclosed in Alles, U.S. Pat. No. 3,458,311 which do not contain water-insoluble dispersed particles.

The novel overcoating compositions of the invention are useful not only in preparing printing plates as disclosed in the above Alles patent but may also be used to advantage in preparing printed circuits and in other photomechanical uses where higher photospeed and resolution are needed. The elements of the invention are particularly useful for making duplicate images of printed circuits from which printed circuits can be made.

While the photosensitive stratum of the invention is described as photopolymerizable, elements which photoharden by related mechanisms such as photocrosslinking and photodimerization are included in the scope of the invention.

The invention will now be further illustrated in and by the following examples, wherein the amounts and percentages in the compositions are all by weight unless otherwise indicated.

EXAMPLE I

A photopolymerizable composition was prepared from the following ingredients:

| | |
|---|---|
| Poly(methyl methacrylate/methacrylic acid) (90/10) | 300.0 grams |
| Trimethylolpropane triacrylate | 114.0 grams |
| 2-(O-chlorophenyl)4,5-bis(m-methoxyphenyl) imidazolyl dimer | 11.2 grams |
| Tris-(p-dimethylamino-o-tolyl) methane | 9.0 grams |
| 4,4'-bis(p-dimethylamino)benzophenone | 6.0 grams |
| Solvent Red C.I. #109 | 6.0 grams |
| Mixture of decanoic and octanoic acid ester of triethylene glycol | 36.0 grams |
| 4,4',4''-methylidynetris(N,N-dimethylaniline) | 2.0 grams |
| 2-ethoxyethanol to bring total weight to | 1500.0 grams |

The above ingredients were thoroughly mixed by mechanical stirring and coated on aluminum supports and dried as described in Alles, U.S. Pat. No. 3,458,311 to give a dry coating weight of about 50 mg/dm$^2$. After drying, one plate was overcoated with a 3% aqueous solution of polyvinyl alcohol (medium viscosity 88% hydrolyzed polyvinyl acetate) containing 2% based on the weight of total solids iso-octyl/phenoxypolyethoxy/ethanol (9-10 ethoxy groups) to give a coating weight of 5 mg/dm$^2$ and another plate was coated with a 4% aqueous solution of polyvinyl alcohol (medium viscosity, 88% hydrolyzed polyvinyl acetate) and polyvinyl pyrrolidone in a ratio of 90/60 containing 2% of iso-octyl/phenoxypolyethoxy/ethanol (9-10 ethoxy groups) to give a coating weight of about 9.6 mg/dm$^2$. These photosensitive elements were used as controls in the tests described below. A third plate, having the above photosensitive layer coated thereon, was overcoated with a composition comprising a 3% aqueous solution of medium viscosity polyvinyl alcohol (99-100% hydrolyzed polyvinyl acetate) having dispersed therein a polyvinylidene chloride latex [having a viscosity of 75 cps max. at 25° C and 60% T.S. (Brookfield #1 spindle, 60 F.P.M)] to give a ratio of 30 parts of polyvinylidene chloride and 70 parts of polyvinyl alcohol on a dry weight basis. A small amount, (approximately 1%) of the above iso-octyl/phenoxypolyethoxy/ethanol (9-10 ethoxy groups) surfactant was also added. The overcoated plates were dried by means of infra-red lamps to remove about 98% of the water. The plate temperature should not exceed 230° F.

To test the adhesion of the overcoating to the photosensitive layer, the following procedure was carried out.

Sheets of the controls and sample of the photosensitive elements were scribed in 36 blocks of ¼ inch squares in a 3 × 12 inches area and a Scotch ® Lithographic Tape No. 616 adhesive tape was adhered to the area, being careful to make a smooth application to insure good contact between tape and sample. The tape is then immediately pulled off quickly, pulling parallel to the plate. The total of squares of overcoating left on the plate is taken as a percentage of the total number of squares scribed on the plate. The higher the percentage, the greater the adhesion the overcoating will have to the photosensitive layer.

Upon pulling off the tape from the control containing only polyvinyl alcohol, all of the squares of the overcoating came off thus indicating poor adhesion and minimal protection against oxygen inhibition during exposure in areas where the overcoat was pulled off by the tape. The control containing polyvinyl alcohol and polyvinyl pyrrolidone showed about 39% squares left showing some improvement in adhesion. The sample showed 75% of the scribed squares of the overcoating left after removal of the tape thus indicating a substantial improvement in adhesion with the sample containing polyvinylidene chloride latex.

To further test the efficacy of the addition of the water-insoluble polyvinylidene chloride latex to the aqueous polyvinyl alcohol solution, the following procedure was carried out to determine the tackiness of the layers under conditions of high humidity.

A sandwich arrangement was made by placing pieces of "goldenrod" paper (used in preparing exposure flats for lithographic platemaking) along with pieces of film carrying various opaquing materials painted thereon, between and in contact with the overcoating layers of two panels of each of the controls and the sample plates. The sandwich arrangement was allowed to equilibrate at 80-90% relative humidity at 90°-100° F for 16-24 hours. The paper, film emulsion layer and opaqued areas absorb moisture and develop a certain amount of tackiness. The conditioned sandwich was then carefully placed in a moistureproof polyethylene bag, sealed, and quickly transferred to a vacuum frame and given a simulated exposure. Pressure on the vacuum frame and heat from the exposure source cause the plates to come into intimate contact with the paper and film between them. Exposure was prolonged over that necessary for image exposure in order to exaggerate the effects of heat and pressure. It was found that both controls showed some sticking of the opaquing materials to the overcoating layer and that there was severe sticking of the paper to the overcoating layer comprising polyvinyl alcohol and polyvinyl pyrrolidone. In such cases, it was virtually impossible to remove the paper fibers without damage to the layer. The overcoating of the sample having the vinylidene chloride polymer dispersed therein showed no tendency for the paper to stick to the overcoating layer and very little tendency for the opaquing material to adhere to said layer. This test showed that the novel compositions of this invention provides substantial improvement in overcoming the problems attendant with tackiness.

All plates were exposed for 42 seconds in a vacuum printing frame under a high contrast negative by a 140-ampere carbon arc at 56 inches.

The images were developed by washing out the unexposed areas of the plates with a solution having the following composition:

| | |
|---|---|
| Water | 750 ml |
| Sodium silicate (SiO$_2$:Na$_2$O 3.85/1.0) | 78 gm |
| 2-n-Butoxy ethanol | 60 ml |
| Iso-octyl phenoxy ethoxy ethanol (9-10 ethoxy groups) | 2 ml |
| Water to make | 1 liter |

After developing and rinsing, the plates were finished by gumming in a conventional manner and reproductions were made using a wet offset printing press using the usual black lipophilic ink and fountain solution. The overcoat of all plates washed off during development not only in the unexposed areas, but also from the exposed areas leaving image areas having a high receptivity for the ink. The sample plate showed no loss in photographic speed as compared to the controls thus indicating good oxygen impermeability of the sample layer.

EXAMPLE II

Example I was repeated using the controls described in that Example and a third plate having the photosensitive layer coated thereon, was overcoated with a 5% aqueous solution of a copolymer of 2 mole percent methyl methacrylate and 98% mole percent of vinyl acetate which had been 99–100% hydrolyzed. Said aqueous solution had dispersed therein, a sequentially polymerized poly(vinylidene chloride/methyl methacrylate/itaconic acid) (90/10/2) co ethyl acrylate (75/25) prepared in the manner described in Procedure A of Rawlins, U.S. Pat. No. 3,443,950. The aqueous composition also contained 1% by weight based on the dispersed polymeric composition of iso-octyl phenoxy ethoxy ethanol (9–10 ethoxy groups) surfactant and the ratio of the polyvinyl alcohol copolymer to the dispersed polymer was about 70:30. The resulting composition was coated to give a dry coating weight of approximately 9.8 mg/dm$^2$. Adhesive tape tests indicated that 78% of the scribed squares adhered to the photosensitive layer. The results of the tackiness test were comparable to those of Example I. The photographic speed was comparable to that of the sample of Example I.

EXAMPLE III

A photopolymerizable composition was prepared from the following ingredients:

| | |
|---|---|
| Poly(methyl methacrylate/methacrylic acid) (90/10) | 624.0 grams |
| Pentaerythritol triacrylate | 406.0 grams |
| Triethylene glycol diacetate | 128.0 grams |
| Tertiary butyl anthraquinone | 9.4 grams |
| 9,10-phenanthrenequinone | 7.2 grams |
| Pontacyl Wool Base G.L. (C.I. Acid #102) · | 14.0 grams |
| 2-(p-dimethylaminostyryl)-3-cetyl-4-methyl-4-hydroxymethyloxazolinium bromide | 10.0 grams |

The above ingredients were thoroughly mixed by mechanical stirring and coated on aluminum supports and dried as described in Example I to give a coating weight of 30 mg/dm$^2$.

After drying, two of the plates were overcoated to give the controls described in Example I. A third plate was overcoated with a 6% aqueous solution of (medium viscosity) polyvinyl alcohol (99% hydrolyzed polyvinyl acetate) having dispersed therein a vinylidene chloride/acrylonitrile copolymer in the form of a 51.5–53.0% aqueous dispersion. The dispersion had a Brookfield viscosity at 25° C of 50 centipoises, and was present in an amount to give a ratio of polyvinyl alcohol to the copolymer of 40:60. The dispersion also contained about 0.5% of iso-octyl phenoxy ethoxy ethanol (9–10 ethoxy groups) surfactant based on the weight of total solids in the dispersion. The coating weight was about 8 mg/dm$^2$. The dried samples (including the controls) were exposed through a $\sqrt{2}$ neutral density step wedge for 100 seconds with a 140 ampere carbon arc lamp at a distance of 56 inches and developed for 30 seconds in the following developer.

| | |
|---|---|
| Sodium hexametaphosphate | 12.0 grams |
| Trisodium phosphate | 25.0 grams |
| Dihydrogen sodium phosphate | 4.4 grams |
| Iso-octyl phenoxy ethoxy ethanol (9-10 ethoxy groups) (10%) | 2.0 ml |
| Butyl cellosolve | 45.0 ml |
| Water to make pH = 11.0 ± 0.10 | 1.0 liter |

All of the plates yielded 4 steps which were polymerized sufficiently to resist removal by the development. The adhesion tests showed 86% of the scribed squares left and the results of the tackiness test were comparable to those above. This showed that the presence of the dispersed copolymer had no deleterious affect on the photographic speed of the plate.

EXAMPLE IV

An aqueous overcoat dispersion was prepared from the following ingredients as described below:

| Stock Solution: | |
|---|---|
| Low viscosity polyvinyl alcohol (99-100% hydrolyzed polyvinyl acetate | 60 g |
| Distilled water | 900 g |

The temperature was raised to 93.3° C and maintained until the polyvinyl alcohol was dissolved. The solution was then cooled and the following ingredients added thereto:

| | |
|---|---|
| Iso-octyl phenoxypolyethoxy ethanol (9-10 ethoxy groups, 10% aqueous solution) | 5 g |
| Ethyl alcohol | 5 g |
| Ethyl cellosolve | 5 g |
| Distilled water to | 1000 g |

Overcoat Solutions:
The following solutions were prepared:

| Ingredient Added | Median* Particle Size (μ) | Sample A | B | C | D |
|---|---|---|---|---|---|
| Stock Solution | — | 200 g | 200 g | 200 g | 200 g |
| Teflon ® T-30 (Du Pont Co.), aq. disp. of polytetrafluoroethylene, 5.7% in distilled H$_2$O | 0.68 | — | 21.2 g | — | — |
| Tripolymer of acrylonitrile (50%), butylacrylate (45%), methacrylic acid (5%), 48.3% solids in distilled H$_2$O | 0.76 | — | — | 2.4 g | — |
| Sequentially polymerized poly-(vinylidene chloride/ | | | | | |

-continued

Overcoat Solutions:
The following solutions were prepared:

| Ingredient Added | Median* Particle Size (μ) | Sample A | B | C | D |
|---|---|---|---|---|---|
| methyl methacrylate/ itaconic acid - 90/10/2 (see Ex. II) | 0.60 | — | — | — | 1.20 g |

*Particle sizes were measured by the Coulter-Counter®, Coulter Electronics, Inc., Hialeah, Florida.

These solutions were used to overcoat four aluminum plates containing a photopolymerizable layer similar to that described in Example I. The coating weights of the protective layer were about 11 ± 3 mg/dm². The plates were then dried and the adhesion test (utilizing tape) described in Example I was performed on each sample with the following results:

| Sample | % Adhesion |
|---|---|
| A - Control - No particles | 0 |
| B - Teflon®- T-30 particles | 14.6 |
| C - Acrylonitrile terpolymer particles | 16.7 |
| D - Particles of this invention | 41.7 |

Samples of the above referenced coatings were exposed and developed as described in Example I. All samples had equivalent photographic speed indicating the excellent oxygen impermeability characteristics of the polyvinyl alcohol had been maintained. However, only the particles of this invention gave a protective layer with improved adhesion to the photopolymer layer indicating a clear improvement over other particulate matter taught as protective layer adjuvants by the prior art.

I claim:

1. A photopolymerizable element comprising, in order, (1) a support, (2) a solid photopolymerizable stratum, and (3) an adherent, solid, protective stratum over the entire area of said photopolymerizable stratum transparent to actinic radiation, said protective stratum having a thickness of 0.2 to 25 microns and being characterized in that it is (i) non-strippable as an unsupported film, (ii) substantially impermeable to oxygen, and (iii) water permeable and composed of a macromolecular organic polymer or polymer mixture which is soluble in water or in a mixture of water and a water-miscible organic solvent, said protective stratum having dispersed therein, solid particles of at least one water insoluble, chlorinated vinyl polymer selected from the group consisting of vinylidene chloride-acrylonitrile copolymer, vinylidene chloride-lower alkyl acrylate-itaconic acid terpolymer, poly(vinylidene chloride), and poly(vinylidene chloride-methyl methacrylate-itaconic acid) coethyl acrylate, said particles being at least 0.05 micron in diameter and being present in amounts from 10 to 60 percent by weight of the total polymer in said protective stratum.

2. A photopolymerizable element of claim 1 wherein said photopolymerizable stratum is comprised of
   (a) at least one nongaseous ethylenically unsaturated monomeric compound containing at least one terminal ethylenic group, and being capable of forming an insoluble polymer by photoinitiated addition polymerization,
   (b) an addition polymerization initiating system activatable by actinic radiation, and
   (c) an organic macromolecular polymer binder for and compatible with said unsaturated monomeric compound.

3. A photopolymerizable element of claim 1 wherein said macromolecular organic polymer is selected from polyvinyl alcohol and copolymers and derivatives thereof, gelatin, and gum arabic.

4. A photopolymerizable element of claim 1 wherein said protective stratum contains colloidal silica.

5. A photopolymerizable element according to claim 1 wherein said support is a flexible sheet support having a hydrophilic surface.

6. A process of protecting a photopolymerizable element against oxygen-inhibition comprising coating the photopolymerizable stratum of said element with an aqueous solution of a macromolecular organic polymer having solid particles of at least one water-insoluble chlorinated vinyl polymer dispersed therein, to form the protective stratum of claim 1 on said photopolymerizable stratum.

* * * * *